(12) United States Patent
Kim et al.

(10) Patent No.: US 9,223,195 B2
(45) Date of Patent: Dec. 29, 2015

(54) EXPOSURE APPARATUS HAVING BLIND AND METHOD OF DRIVING

(75) Inventors: Chang-Hoon Kim, Asan-si (KR); Hong-Suk Yoo, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 707 days.

(21) Appl. No.: 13/477,992

(22) Filed: May 22, 2012
(Under 37 CFR 1.47)

(65) Prior Publication Data

US 2013/0077067 A1    Mar. 28, 2013

(30) Foreign Application Priority Data

May 27, 2011   (KR) .......................... 10-2011-0050672

(51) Int. Cl.
*G03B 27/42*     (2006.01)
*G03F 7/20*      (2006.01)

(52) U.S. Cl.
CPC ............ *G03B 27/423* (2013.01); *G03F 7/7055* (2013.01)

(58) Field of Classification Search
CPC .............. G03F 7/70558; G03F 7/7055; G03F 7/70066; G03F 7/20; G03F 7/70191; G03F 7/70383; G03F 7/7035
USPC ...................................... 355/53, 67
See application file for complete search history.

(56) References Cited

U.S. PATENT DOCUMENTS

| 6,332,684 | B1 * | 12/2001 | Shibatani et al. | ............... 353/31 |
| 6,559,901 | B2 * | 5/2003 | Yamamoto et al. | ............... 349/5 |
| 2005/0270513 | A1 * | 12/2005 | Dierichs et al. | ................. 355/67 |
| 2009/0073404 | A1 * | 3/2009 | Muramatsu | ..................... 355/53 |

* cited by examiner

*Primary Examiner* — Mesfin T Asfaw
(74) *Attorney, Agent, or Firm* — H.C. Park & Associates, PLC (57) ABSTRACT

An exposure apparatus includes a light source, a mask, a blind, and a blind driver. The light source emits light in a light emitting cycle. The mask is disposed over a substrate and includes an exposure window. A pattern is formed in the exposure window. The blind is disposed over the exposure window. The blind moves in a first direction to block a non-exposed area in the substrate. The blind is returned to pass through the exposure window area in a second direction opposite to the first direction. The blind includes a plurality of blocking plates. The blocking plates include a blocking portion and an opening portion. The blind driver drives the blind.

23 Claims, 8 Drawing Sheets

EXPOSURE APPARATUS HAVING BLIND AND METHOD OF DRIVING

CROSS REFERENCE TO RELATED APPLICATION

This application claims priority from and the benefit of Korean Patent Application No. 10-2011-0050672, filed on May 27, 2011, which is incorporated by reference for all purposes as if fully set forth herein.

BACKGROUND

1. Field

Exemplary embodiments of the present invention relate to an exposure apparatus having a blind and a method of driving the exposure apparatus. More particularly, exemplary embodiments of the present invention relate to an exposure apparatus having a blind capable of removing a stain on a substrate to improve display quality and a method of driving the exposure apparatus.

2. Discussion of the Background

Generally, a liquid crystal display (LCD) apparatus includes an LCD panel including a thin film transistor (TFT) substrate, a color filter substrate opposite to the TFT substrate and a liquid crystal layer disposed between the TFT substrate and the color filter substrate.

The TFT substrate and the color filter substrate generally have a multi-layered structure formed by a photo step, an exposure step, and an etching step.

In the exposure step, light is irradiated on a substrate, on which a photoresist layer is coated, through a photo mask having a specific pattern. The photoresist layer is reacted with the light to form the pattern according to the pattern formed on the photo mask.

To decrease a cost for manufacturing the liquid crystal display apparatus, a size of a mother substrate increases so that more liquid crystal display panels are formed in one manufacturing process. However, according to an increase of the size of the mother substrate, a size of the photo mask may be also increased so that the cost for manufacturing the liquid crystal display apparatus may be increased.

Recently, a small mask type exposure process is employed in order to decrease the size of the photo mask, in a conventional photolithography method. In the small mask type exposure process, the substrate is exposed using a plurality of exposures and a plurality of small photo masks which are moving.

The substrate has an exposed area and a non-exposed area. The exposure includes a blind blocking an exposure window of the photo mask to prevent the non-exposed area from being exposed. The blind is moved from a first side of the exposure window to a second side of the exposure window to block a first non-exposed area. The blind should be returned from the second side of the exposure window to the first side of the exposure window after blocking the first non-exposed area to be ready to cover a second non-exposed area.

However, when the blind is returned, the blind passes through an exposure window area so that the light may be partially blocked by the blind. Accordingly, a stain may appear in the exposed area due to different amounts of exposure.

When the stain is relatively serious, the display quality of the liquid crystal display panel may be deteriorated. Even when the stain is not relatively serious, the stain may be a noise for detecting other display errors. Thus, the display quality may be deteriorated.

SUMMARY OF THE INVENTION

Exemplary embodiments of the present invention provide an exposure apparatus including a blocking plate including an opening portion to prevent the stain on a substrate due to the blocking plate.

Exemplary embodiments of the present invention also provide a method of driving the exposure apparatus.

Additional features of the invention will be set forth in the description which follows, and in part will be apparent from the description, or may be learned by practice of the invention.

An exemplary embodiment of the present invention discloses an exposure apparatus, including: a light source to emit light in a light emitting cycle; a mask disposed on a substrate comprising an exposure window, a pattern being formed therein; a blind comprising a plurality of blocking plates, each blocking plate comprising a blocking portion and an opening portion, the blind disposed over the exposure window to move in a first direction to block a non-exposed area on the substrate and to pass through the exposure window area in a second direction opposite to the first direction; and a blind driver to drive the blind.

An exemplary embodiment of the present invention also discloses a method of driving an exposure apparatus, the method including: emitting light from a light source in a light emitting cycle; moving a plurality of blocking plates in a first direction to block light from reaching a non-exposed area of a substrate, wherein the blocking plates are disposed over the substrate and an exposure window of a mask, and the blocking plates comprise a blocking portion and an opening portion; and moving the blocking plates to pass through the exposure window area of the mask in a second direction opposite to the first direction.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
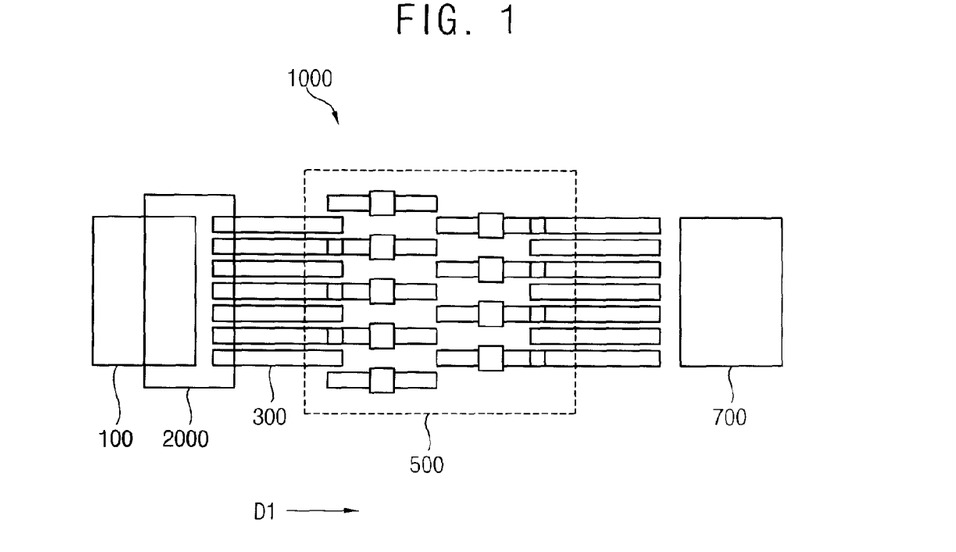
FIG. 1 is a plan view of an exposure apparatus according to an exemplary embodiment of the present invention.

FIG. 1 is a plan view of an exposure apparatus according to an exemplary embodiment of the present invention.

Referring to FIG. 1, an exposure apparatus 1000 includes a loading part 100, a stage 300, an exposure part 500, and an unloading part 700.

The loading part 100 loads a substrate 2000 from outside of the exposure apparatus 1000, and the substrate 2000 is exposed by the exposure apparatus 1000.

The stage 300 transfers the substrate 2000 from the loading part 100 to the exposure part 500 along a first direction D1, and transfers the substrate 2000 from the exposure part 500 to the unloading part 700. The stage 300 extends along the first direction D1.

The substrate 2000 may be exposed by a scan type or a step type. In the scan type exposing, the stage 300 may continuously transfer the substrate 2000. In the step type exposing, the stage 300 may discontinuously transfer the substrate 2000 with a repetition of movements and stops. The scan type exposing may be applied to form a strip pattern on the substrate 2000. The step type exposing may be applied to form an island pattern on the substrate 2000.

The stage 300 may use a magnetic levitation method to transfer the substrate 2000.

The exposure part 500 irradiates the light to the substrate 2000, which is transferred from the stage 300, to form a pattern on the substrate 2000. The fixed exposure part 500 exposes the substrate 2000 moving in the first direction D1 so that the pattern on the substrate 2000 may have a direction opposite to the first direction D1.

The exposure part 500 may include a plurality of exposure modules. The exposure modules are disposed in a plurality of columns. For example, the exposure modules are disposed in two columns. The exposure modules in a first column are alternately disposed with the exposure modules in a second column so that the substrate 2000 may be entirely exposed by the exposure modules. As shown in FIG. 1, five exposure modules may be disposed in the first column, and four exposure modules may be disposed in the second column.

A structure and an operation of the exposure part 500 are explained below in detail.

The unloading part 700 unloads the substrate 2000, on which the pattern is formed, to outside of the exposure apparatus 1000.

The substrate 2000 may be a thin film transistor (TFT) substrate or a color filter substrate, which are essential elements of a liquid crystal display (LCD) panel of an LCD apparatus displaying an image. The TFT substrate may include TFTs disposed in a matrix pattern on a glass substrate as a switching element. The color filter substrate may include red, green, and blue pixels.

Figure 2:
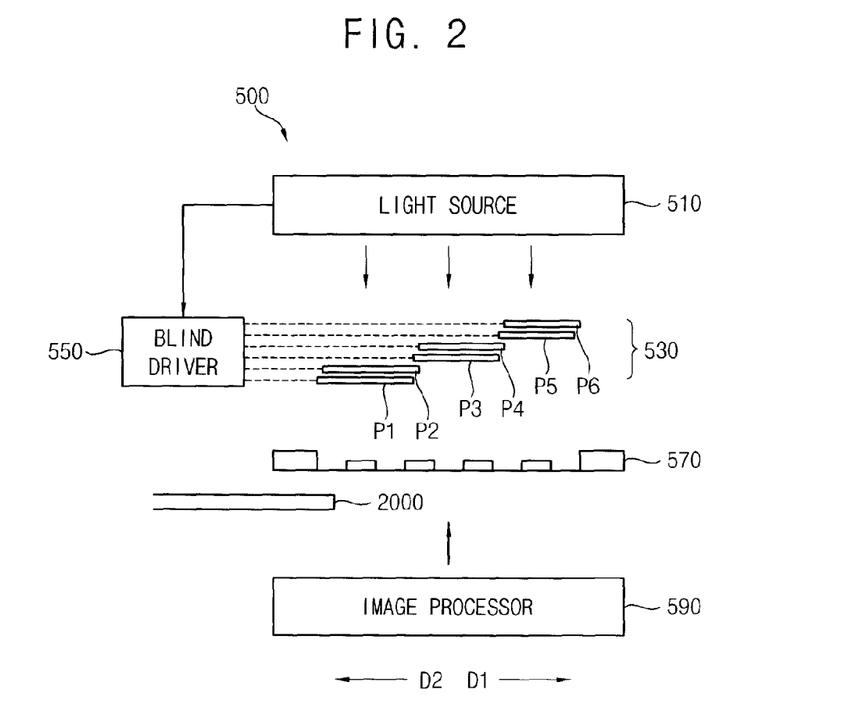
FIG. 2 is a diagram of an exposure part of the exposure apparatus of FIG. 1.
Figure 3:
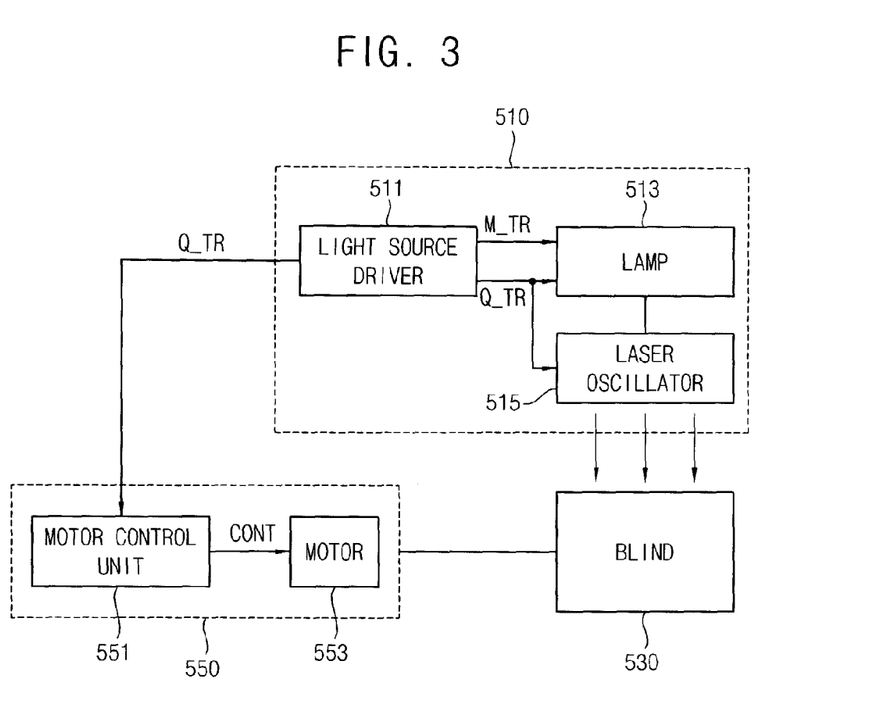
FIG. 3 is a block diagram of a portion of the exposure part of FIG. 2.
Figure 4:
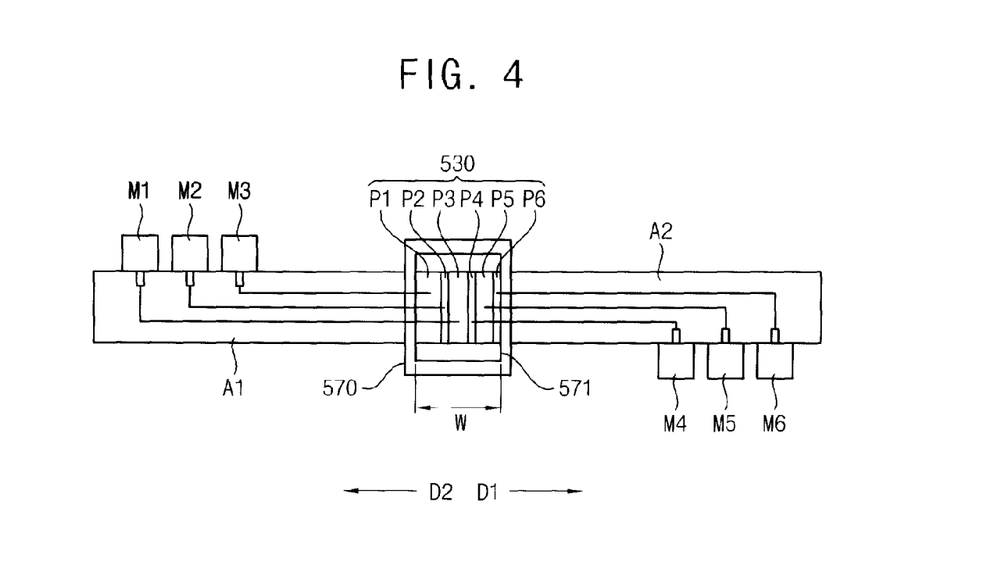
FIG. 4 is a plan view of a blind of FIG. 2.

FIG. 2 is a diagram of the exposure part of the exposure apparatus of FIG. 1. FIG. 3 is a block diagram illustrating a portion of an exposure part of FIG. 2. FIG. 4 is a plan view of a blind 530 of FIG. 2.

Referring to FIG. 2, FIG. 3, and FIG. 4, the exposure part 500 includes a light source 510, a blind 530, a blind driver 550, a mask 570, and an image processor 590. The exposure part 500 may include a plurality of exposure modules. Each of the exposure modules may include the light source 510, the blind 530, the blind driver 550, the mask 570, and the image processor 590.

The light source 510 is disposed over the blind 530 and the mask 570 to irradiate the light toward the mask 570. The light may be irradiated substantially perpendicular to a plane of the mask 570.

The light source 510 includes a light source driver 511, a lamp 513, and a laser oscillator 515. The lamp 513 may include a mercury lamp. The laser oscillator 515 may include an Nd-YAG laser oscillator. The light source 510 may include a light concentrating part (not shown) which concentrates the light from the laser oscillator 515. The light concentrating part may include at least one reflective lens.

The light source driver 511 outputs a master trigger signal M_TR and a laser oscillation start signal Q_TR to the lamp 513.

The lamp 513 emits the light in response to the master trigger signal M_TR. The lamp 513 stops emitting the light in response to the laser oscillation start signal Q_TR.

The laser oscillator 515 oscillates a laser beam based on the light from the lamp 513 in response to the laser oscillation start signal Q_TR.

The light source 510 emits the light in a predetermined cycle. For example, when a frequency of the light source 510 is about 50 Hz, the light emitting cycle may be about 20 msec. The laser oscillation period may be very short in the light emitting cycle. Thus, a non-oscillation period of the laser may be substantially 20 msec.

The blind 530 is disposed over the exposure window 571 of the mask 570 so that the blind 530 blocks the light irradiated from the light source 510 from passing through the mask 570. The blind 530 is used to block a non-exposed area of the substrate 2000.

The blind 530 includes a plurality of blocking plates. For example, the blind 530 may include six blocking plates: blocking plate P1, blocking plate P2, blocking plate P3, blocking plate P4, blocking plate P5, and blocking plate P6.

The blind 530 extends in the first direction D1, and the blocking plate P1, the blocking plate P2, the blocking plate P3, the blocking plate P4, the blocking plate P5, and the blocking plate P6 may be moved within moving area A1 and moving area A2.

The blocking plate P1, the blocking plate P2, the blocking plate P3, the blocking plate P4, the blocking plate P5, and the blocking plate P6 may be disposed in different planes from each other and may move individually. The blocking plate P1, the blocking plate P2, the blocking plate P3, the blocking plate P4, the blocking plate P5, and the blocking plate P6 may be formed to overlap with each other in a plan view. The blocking plate P1, the blocking plate P2, the blocking plate P3, the blocking plate P4, the blocking plate P5, and the blocking plate P6 may be disposed in the first direction D1, and extend in a direction substantially perpendicular to the first direction D1. Each of the blocking plate P1, the blocking plate P2, the blocking plate P3, the blocking plate P4, the blocking plate P5, and the blocking plate P6 may have a rectangular parallelepiped shape. The blocking plate P1, the blocking plate P2, the blocking plate P3, the blocking plate P4, the blocking plate P5, and the blocking plate P6 may include a carbon fiber material.

Each of blocking plate P1, blocking plate P2, blocking plate P3, blocking plate P4, blocking plate P5, and blocking plate P6 includes a blocking portion and an opening portion. The blocking plate P1, the blocking plate P2, the blocking plate P3, the blocking plate P4, the blocking plate P5, and the blocking plate may overlap with each other so that the opening portion of a blocking plate is blocked by another blocking plate.

A first blocking plate group includes a first blocking plate P1 and a second blocking plate P2. The first blocking plate P1 and the second blocking plate P2 overlap with each other so that a blocking portion of the first blocking plate P1 may cover an opening portion of the second blocking plate P2 and a blocking portion of the second blocking plate P2 may cover an opening portion of the first blocking plate P1. Thus, the first blocking plate P1 and the second blocking plate P2 in the first blocking plate group may function as a blind blocking a non-exposed area of the substrate 2000.

In a similar way, a second blocking plate group includes a third blocking plate P3 and a fourth blocking plate P4. The third blocking plate P3 and fourth blocking plate P4 overlap with each other so that a blocking portion of the third blocking plate P3 may cover an opening portion of the fourth blocking plate P4 and a blocking portion of the fourth blocking plate P4 may cover an opening portion of the third blocking plate P3.

In a similar way, a third blocking plate group includes a fifth blocking plate P5 and a sixth blocking plate P6. The fifth blocking plate P5 and the sixth blocking plate P6 overlap with each other so that a blocking portion of the fifth blocking plate P5 may cover an opening portion of the sixth blocking plate P6 and a blocking portion of the sixth blocking plate P6 may cover an opening portion of the fifth blocking plate P5.

The first blocking plate P1 may have a width substantially the same as the second blocking plate P2 in the first direction D1. The third blocking plate P3 may have a width substantially the same as the fourth blocking plate P4 in the first direction D1. The fifth blocking plate P5 may have a width substantially the same as the sixth blocking plate P6 in the first direction D1.

The first blocking plate P1 and the second blocking plate P2 in the first blocking plate group may have widths different from the third blocking plate P3 and the fourth blocking plate P4 in the second blocking plate group. In addition, the third blocking plate P3 and the fourth blocking plate P4 in the second blocking plate group may have widths different from the fifth blocking plate P5 and the sixth blocking plate P6 in the third blocking plate group. Accordingly, the first blocking plate P1, the third blocking plate P3, and the fifth blocking plate P5 may be selectively used according to a width of the non-exposed area.

Although the blind 530 is depicted to include blocking plate P1, blocking plate P2, blocking plate P3, blocking plate P4, blocking plate P5, and blocking plate P6 in FIG. 2, FIG. 3, and FIG. 4, the present invention is not limited thereto. In addition, although each blocking group is described to include two blocking plates overlapped with each other in FIG. 2, FIG. 3, and FIG. 4, the present invention is not limited thereto.

The blind driver 550 includes a motor control unit 551 and a plurality of motors, collectively motors 553. The motor control unit 551 outputs a motor control signal CONT to control the motors 553. The motors 553 are connected to the blocking plates P1 to P6 of the blind 530.

Referring to FIG. 4, the motor M1, motor M2, motor M3, motor M4, motor M5, and motor M6 are each connected to one of the blocking plate P1, the blocking plate P2, the blocking plate P3, the blocking plate P4, the blocking plate P5, and the blocking plate P6. For example, a first motor M1 may be connected to a first blocking plate P1. A second motor M2 may be connected to a second blocking plate P2. A third motor M3 may be connected to a third blocking plate P3. A fourth motor M4 may be connected to a fourth blocking plate P4. A fifth motor M5 may be connected to a fifth blocking plate P5. A sixth motor M6 may be connected to a sixth blocking plate P6. The motor M1, motor M2, motor M3, motor M4, motor M5, and motor M6 may be connected to the blocking plate P1, the blocking plate P2, the blocking plate P3, the blocking plate P4, the blocking plate P5, and the blocking plate P6 through a chain. Although not shown in the figures, the blocking plate P1, the blocking plate P2, the blocking plate P3, the blocking plate P4, the blocking plate P5, and the blocking plate P6 may be moved on additional guide rails.

The motors 553 move blocking plate P1, blocking plate P2, blocking plate P3, blocking plate P4, blocking plate P5, and blocking plate P6 in response to the motor control signal CONT. The motor control signal CONT may include a moving signal to move the blocking plate P1, the blocking plate P2, the blocking plate P3, the blocking plate P4, the blocking plate P5, and the blocking plate P6 in the first direction D1 and a return signal to move the blocking plate P1, the blocking plate P2, the blocking plate P3, the blocking plate P4, the blocking plate P5, and the blocking plate P6 in a second direction D2 opposite to the first direction D1. The motors 553 move the blocking plate P1, the blocking plate P2, the blocking plate P3, the blocking plate P4, the blocking plate P5, and the blocking plate P6 in the first direction D1 in response to the moving signal. The motors 553 move or return the blocking plate P1, the blocking plate P2, the blocking plate P3, the blocking plate P4, the blocking plate P5, and the blocking plate P6 in the second direction D2 in response to the return signal.

The motor control unit 551 receives the laser oscillation start signal Q_TR from the light source driver 511. The motor control signal CONT of the motor control unit 551 is synchronized with the laser oscillation start signal Q_TR. The return signal in the motor control signal CONT may also be synchronized with the laser oscillation start signal Q_TR.

The mask 570 is disposed over the substrate 2000, and is disposed under the blind 530. The mask 570 includes the exposure window 571 transmitting the light irradiated from the light source 510. A pattern is formed in the exposure window 571 to selectively transmit the light irradiated from the light source 510. The mask 570 may include the patterns for a rectangular shape pixel or a zigzag shape pixel.

The exposure window 571 may have a rectangular shape. For example, a width W in the first direction D1 may be about 60 mm.

The image processor 590 is disposed under the substrate 2000 and the mask 570. The image processor 590 reads a preset pattern formed on the substrate 2000 to correct alignment between the substrate 2000 and the mask 570.

Figure 5:
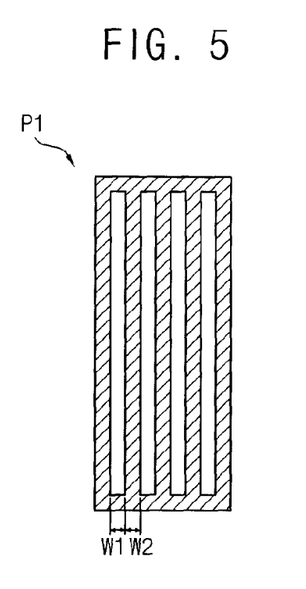
FIG. 5 is a plan view of a blocking plate of FIG. 2.

FIG. 5 is a plan view of the blocking plate of FIG. 2. FIG. 5 illustrates a shape of the first blocking plate P1 among the blocking plates of FIG. 2.

Referring to FIG. 2, FIG. 3, FIG. 4, and FIG. 5, the first blocking plate P1 includes the blocking portion and the opening portion. The first blocking plate P1 may include a plurality of opening portions. The blocking portion and the opening portion of the first blocking plate P1 may be alternately disposed in the first direction D1.

The opening portion of the first blocking plate P1 may extend in a direction substantially perpendicular to the first direction D1. The opening portion may have a rectangular shape.

The opening portion of the first blocking plate P1 has a first width W1 in the first direction D1. The blocking portion of the first blocking plate P1 has a second width W2 in the first direction D1. The first width W1 of the opening portion may be smaller than or equal to the second width W2 of the blocking portion. A sum of the second widths W2 of all blocking portions of the first blocking plate P1 may be larger than or equal to ½ of a width of the first blocking plate P1 in the first direction D1.

For example, the width of the first blocking plate P1 in the first direction D1 may be 18 mm. The first blocking plate P1 may include four opening portions. The first width W1 of the opening portion may be 2 mm. The second width W2 of the blocking portion may also be 2 mm.

The second blocking plate P2 overlaps with the first blocking plate P1 and may have a shape substantially the same as the first blocking plate P1.

Figure 6:
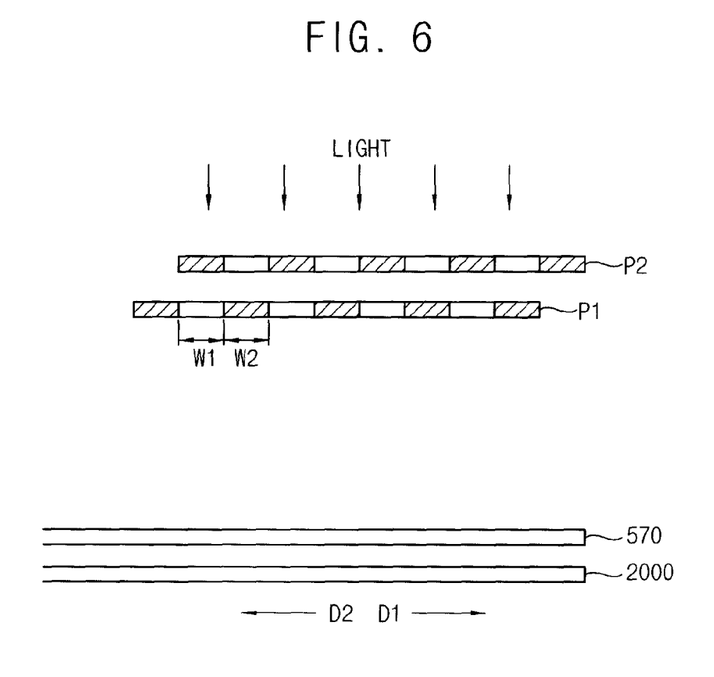
FIG. 6 is a cross-sectional view of the blocking plate of FIG. 2.

FIG. 6 is a cross-sectional view of the blocking plate of FIG. 2. FIG. 6 illustrates the operation of the blocking plate in an exposure process.

Referring to FIG. 6, the first blocking plate P1 and the second blocking plate P2 are disposed in an area corresponding to the non-exposed area of the substrate 2000 to prevent the light from being irradiated to the non-exposed area of the substrate 2000.

The first blocking plate P1 and the second blocking plate P2 overlap with each other so that the opening portions of the first blocking plate P1 and the second blocking plate P2 are completely blocked. The opening portion of the first blocking plate P1 is blocked by the blocking portion of the second blocking plate P2. The opening portion of the second blocking plate P2 is blocked by the blocking portion of the first blocking plate P1.

The substrate 2000, the first blocking plate P1, and the second blocking plate P2 are moved along the first direction D1. A moving velocity of the first blocking plate P1 and the second blocking plate P2 in the first direction D1 may be substantially the same as a moving velocity of the substrate 2000 in the first direction D1.

Figure 7:
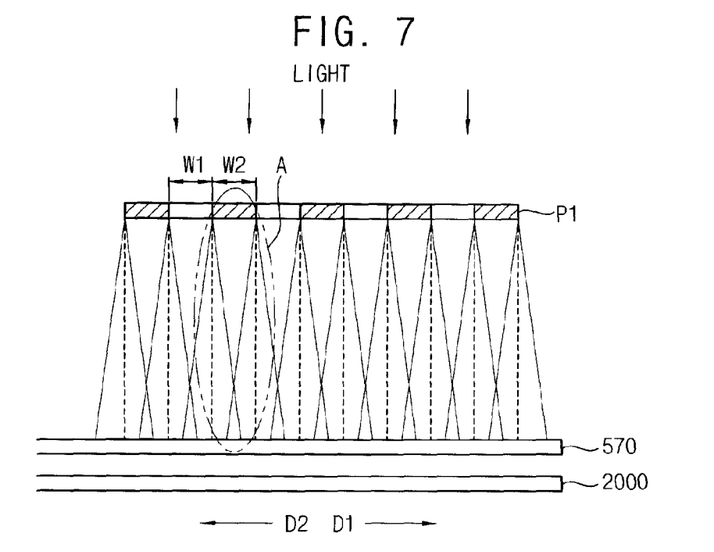
FIG. 7 is a cross-sectional view of the blocking plate of FIG. 2 and a gray region formed by the blocking plate.
Figure 8:
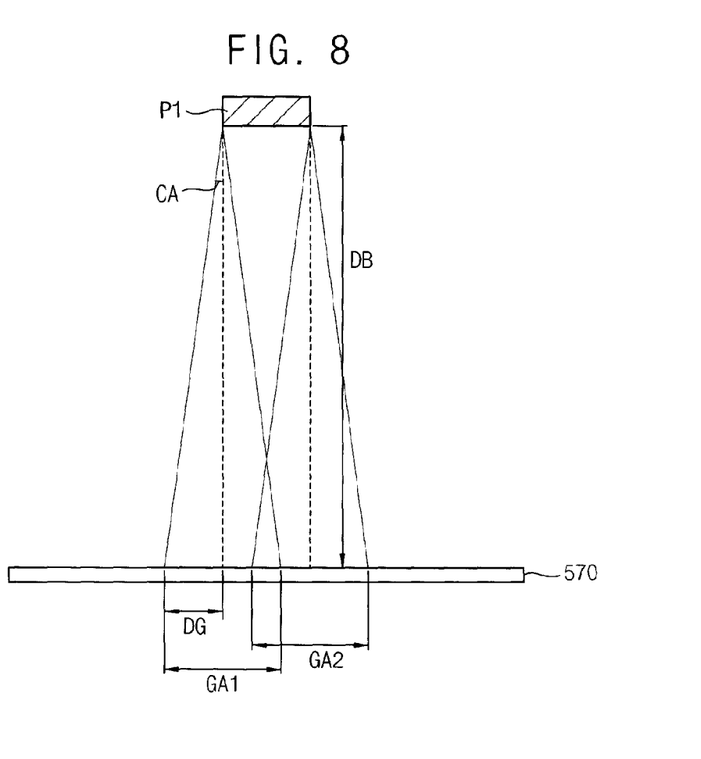
FIG. 8 is an enlarged cross-sectional view of a portion A of FIG. 7.

FIG. 7 is a cross-sectional view of the blocking plate of FIG. 2 and a gray region formed by the blocking plate. FIG. 8 is an enlarged cross-sectional view of a portion A of FIG. 7.

FIG. 7 illustrates a returning operation of the blocking plates of FIG. 2 which results in the blocking plates moving in the second direction D2. The blocking plate P1 and the blocking plate P2 are moved in the first direction D1 to block the non-exposed area. And then, the blocking plate P1 and the blocking plate P2 are returned in the second direction D2 opposite to the first direction D1 to block a next non-exposed area. When the blocking plate P1 and the blocking plate P2 are returned during a light emitting time, the blocking plate P1 and the blocking plate P2 block the light irradiated to an exposed area of the substrate 2000 so that a stain may appear in the exposed area of the substrate 2000.

Referring to FIG. 7 and FIG. 8, the blocking plate P1 and the blocking plate P2 are returned independent from each other. When the first blocking plate P1 is returned in the second direction D2 during the light emitting time, the light is irradiated to regions of the mask 570 and the substrate 2000 corresponding to the opening portion of the first blocking plate P1. Thus, a stain does not appear in the region of the substrate 2000 corresponding to the opening portion.

When, the light is irradiated to the substrate 2000 in a direction exactly perpendicular to the substrate 2000, the light is not irradiated to regions of the mask 570 and the substrate 2000 corresponding to the blocking portion of the first blocking plate P1. Thus, a stain may appear in the region of the substrate 2000 corresponding to the blocking portion.

However, the light source may not generate an exactly perpendicular light so that the light irradiated to the substrate 2000 has an inclined angle CA with respect to the direction perpendicular to the substrate 2000. The light may be irradiated to the region of the substrate 2000 corresponding to the blocking portion of the first blocking plate P1 by the inclined angle CA. A region on the mask 570 corresponding to the blocking portion, to which the inclined light is irradiated, is known as a gray region.

Referring to FIG. 8, a first gray region GA1 is formed by a first end of the blocking portion of the first blocking plate P1. A second gray region GA2 is formed by a second end of the blocking portion of the first blocking plate P1.

A width of the gray region on the mask 570 extending in a second direction D2 from a line perpendicular to the first end of the blocking portion of the first blocking plate P1 is as follows: DG=DB×tan CA. Herein, DB is a distance between the first blocking plate P1 and the mask 570. CA is the inclined angle with respect to the direction perpendicular to the substrate 2000. Thus, the width of the gray region on the mask 570 in both directions with respect to the first end of the blocking portion of the first blocking plate P1 may be 2 DG.

A width of the first gray region GA1 may be substantially the same as 2 DG. A width of the second gray region GA2 may be substantially the same as 2 DG.

When the region on the mask 570 corresponding to the blocking portion of the first blocking plate P1 is covered by the first gray region GA1 and the second gray region GA2, the stain in the region of the substrate 2000 corresponding to the blocking portion of the first blocking plate P1 may be decreased.

The region on the mask 570 corresponding to the blocking portion of the first blocking plate P1 may be partially covered by the first gray region GA1 and the second gray region GA2. Alternatively, the region on the mask 570 corresponding to the blocking portion of the first blocking plate P1 may be entirely covered by the first gray region GA1 and the second gray region GA2.

When the second width W2 of the blocking portion is equal to or smaller than the width of the gray region of 2 DG, the region on the mask 570 corresponding to the blocking portion of the first blocking plate P1 may be entirely covered by the first gray region GA1 and the second gray region GA2.

The second blocking plate P2 may be returned in the second direction D2 in the same manner as the first blocking plate P1. In the returning process of the second blocking plate P2, the light emitting time may be adjusted such that the light may be emitted when the second blocking plate P2 is disposed in a different position from the first blocking plate P1 in the returning process of the first blocking plate P1.

Figure 9:
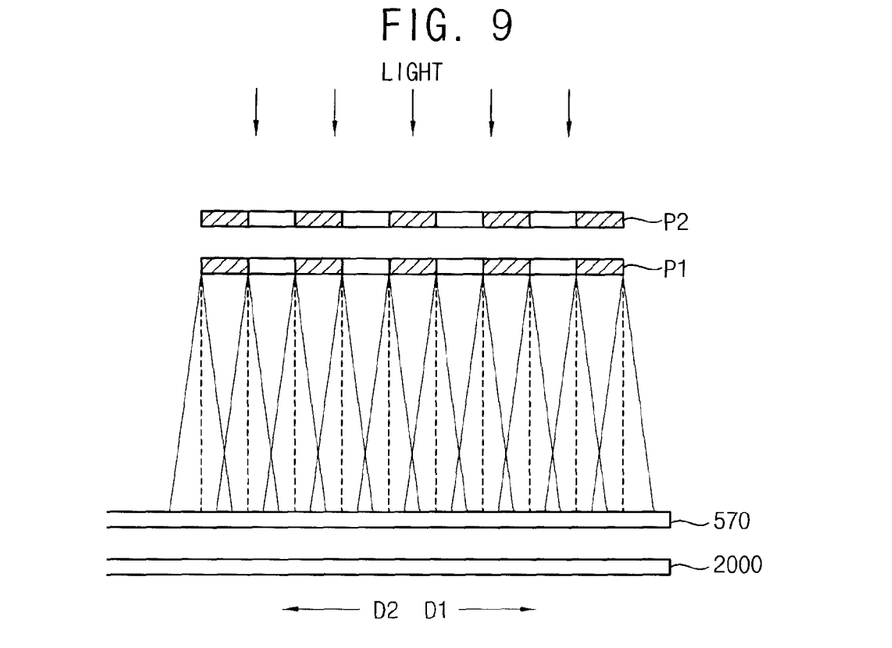
FIG. 9 is a cross-sectional view of a blocking plate and a gray region according to an exemplary embodiment of the present invention.

FIG. 9 is a cross-sectional view of a blocking plate and a gray region according to an exemplary embodiment of the present invention.

The exposure apparatus and the method of driving the exposure apparatus are substantially the same as the exposure apparatus and the method of driving the exposure apparatus described with reference to FIG. 1, FIG. 2, FIG. 3, FIG. 4, FIG. 5, FIG. 6, FIG. 7, and FIG. 8 except that the plurality of blocking plates overlap each other in the returning operation. Thus, descriptions of common elements are omitted for clarity.

Referring to FIG. 9, the first blocking plate P1 and the second blocking plate P2 overlap with each other and are returned simultaneously. The first blocking plate P1 and the second blocking plate P2 are disposed such that the opening portion of the first blocking plate P1 corresponds to the opening portion of the second blocking plate P2.

The opening portion of the first blocking plate P1 overlaps with the opening portion of the second blocking plate P2. The blocking portion of the first blocking plate P1 overlaps with the blocking portion of the second blocking plate P2.

In the returning process of the first blocking plate P1 in FIG. 7 and FIG. 8, a weak stain may appear in a first region of the exposure area of the substrate 2000. In the returning process of the second blocking plate P2 in FIG. 7 and FIG. 8, a weak stain may appear in a second region of the exposure area of the substrate 2000. A weak stain may appear in a first region of the exposure area of the substrate 2000 because the first blocking plate P1 and the second blocking plate P2 return simultaneously in FIG. 9.

An area of the substrate 2000, in which the stain appears, may be decreased compared with the returning process of FIG. 7 and FIG. 8. Furthermore, the returning process of the blocking plates may be expedited.

Figure 10:
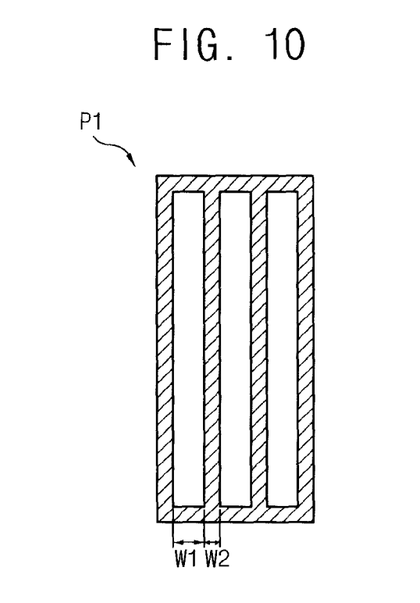
FIG. 10 is a plan view of a blocking plate according to an exemplary embodiment of the present invention.

FIG. 10 is a plan view of a blocking plate according to an exemplary embodiment of the present invention. FIG. 10 illustrates a shape of a first blocking plate P1 among a plurality of blocking plates.

The exposure apparatus and the method of driving the exposure apparatus are substantially the same as the exposure apparatus and the method of driving the exposure apparatus described with reference to FIG. 1, FIG. 2, FIG. 3, FIG. 4, FIG. 5, FIG. 6, FIG. 7, and FIG. 8 except for the number of the blocking plates included in a blocking plate group and the shape of the blocking plate. Thus, descriptions of common elements are omitted for clarity.

A first blocking plate group may include a first blocking plate P1, a second blocking plate P2 and a third blocking plate P3. The first blocking plate P1, the second blocking plate P2, and the third blocking plate P3 overlap with each other so that a blocking portion of the first blocking plate P1 may cover opening portions of the second blocking plate P2 and third blocking plate P3, a blocking portion of the second blocking plate P2 may cover opening portions of the first blocking plate P1 and the third blocking plate P3, and a blocking portion of the third blocking plate P3 may cover opening portions of the first blocking plate P1 and the second blocking plate P2. Thus, the first blocking plate P1, the second blocking plate P2 and the third blocking plate P3 in the first blocking plate group may function as a blind blocking a non-exposed area of the substrate 2000.

The first blocking plate P1, the second blocking plate P2, and the third blocking plate P3 may have substantially the same width in the first direction D1.

Referring to FIG. 10, the first blocking plate P1 includes the blocking portion and the opening portion. The first blocking plate P1 may include a plurality of opening portions. The blocking portion and the opening portion of the first blocking plate P1 may be alternately disposed in the first direction D1.

The opening portion of the first blocking plate P1 may extend in a direction substantially perpendicular to the first direction D1. The opening portion may have a rectangular shape.

The opening portion of the first blocking plate P1 has a first width W1 in the first direction D1. The blocking portion of the first blocking plate P1 has a second width W2 in the first direction D1. The first width W1 of the opening portion may be smaller than or equal to twice of the second width W2 of the blocking portion. A sum of the second widths W2 of all blocking portions of the first blocking plate P1 may be larger than or equal to ⅓ of a width of the first blocking plate P1 in the first direction D1.

The second blocking plate P2 and third blocking plate P3 overlap with the first blocking plate P1 and may have a shape substantially the same as the first blocking plate P1.

Figure 11:
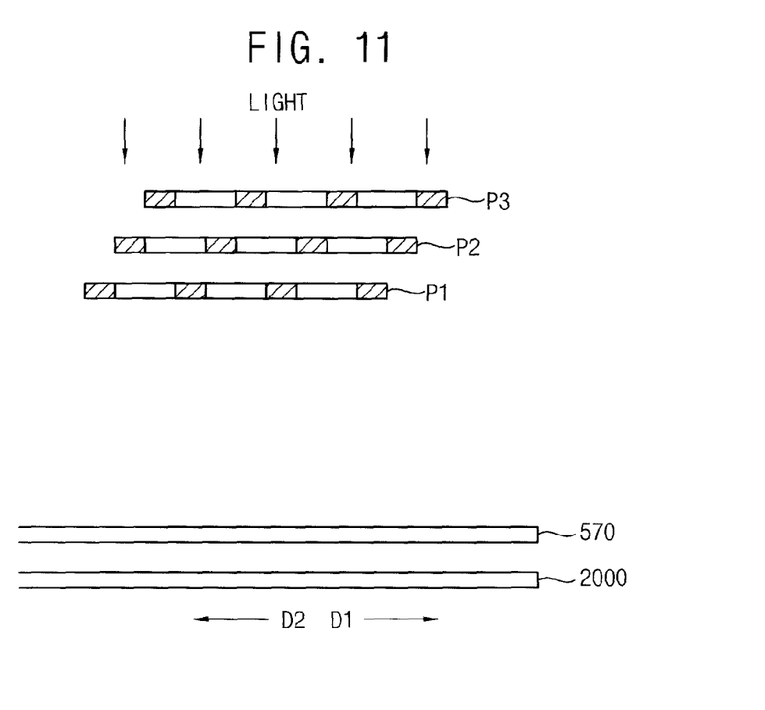
FIG. 11 is a cross-sectional view of the blocking plate of FIG. 10.

FIG. 11 is a cross-sectional view of the blocking plate of FIG. 10. FIG. 11 illustrates an exposure process.

Referring to FIG. 11, the first blocking plate P1, the second blocking plate P2, and the third blocking plate P3 are disposed in an area corresponding to the non-exposed area of the substrate 2000 to prevent the light from being irradiated to the non-exposed area of the substrate 2000.

The first blocking plate P1, the second blocking plate P2, and the third blocking plate P3 overlap with one another so that the opening portions of the first blocking plate P1, the second blocking plate P2, and the third blocking plate P3 are completely blocked. The opening portion of the first blocking plate P1 is blocked by the blocking portions of the second blocking plate P2, and the blocking portions of the third blocking plate P3. The opening portion of the second blocking plate P2 is blocked by the blocking portions of the first blocking plate P1 and the blocking portions of the third blocking plate P3. The opening portion of the third blocking plate P3 is blocked by the blocking portions of the first blocking plate P1 and the blocking portions of the second blocking plate P2.

The substrate 2000 and the first blocking plate P1, the second blocking plate P2, and the third blocking plate P3 are moved along the first direction D1. A moving velocity of the first blocking plate P1, the second blocking plate P2, and the third blocking plate P3 in the first direction D1 may be substantially the same as a moving velocity of the substrate 2000 in the first direction D1.

Figure 12:
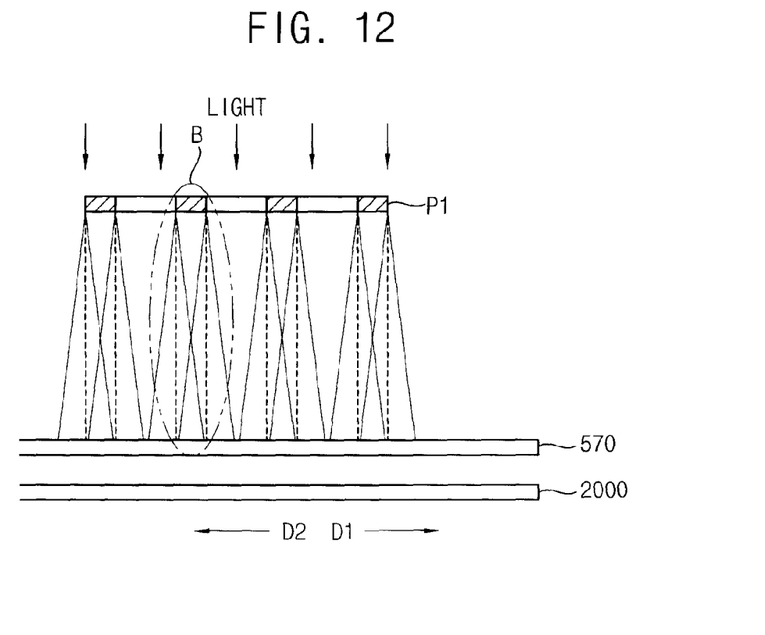
FIG. 12 is a cross-sectional view of the blocking plate of FIG. 10 according to an exemplary embodiment of the present invention.
Figure 13:
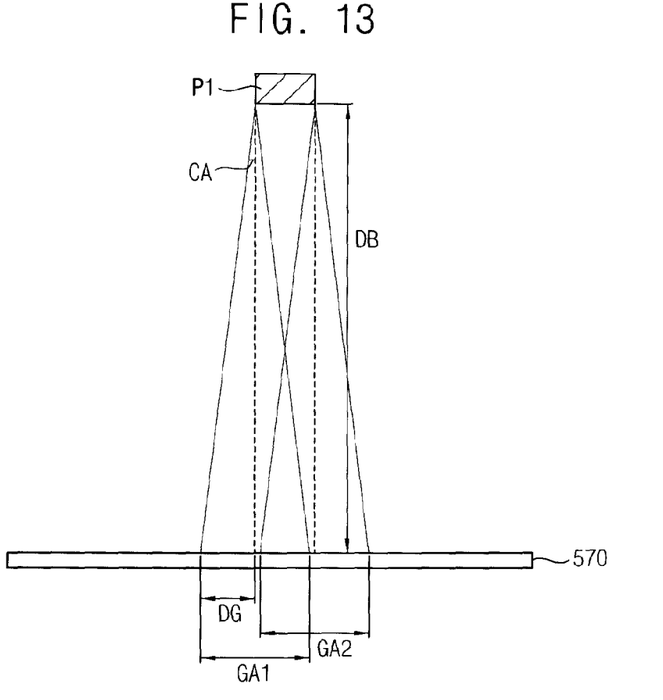
FIG. 13 is an enlarged cross-sectional view of a portion B of FIG. 12.

FIG. 12 is a cross-sectional view of the blocking plate of FIG. 10 according to an exemplary embodiment of the present invention. FIG. 12 illustrates a returning operation of the blocking plate and gray region formed of FIG. 10. FIG. 13 is an enlarged cross-sectional view of a portion B of FIG. 12.

The blocking plate P1, the blocking plate P2, and the blocking plate P3 are moved in the first direction D1 to block the non-exposed area. And then, the blocking plate P1, the blocking plate P2, and the blocking plate P3 are returned in the second direction D2 opposite to the first direction D1 to block a next non-exposed area. When the blocking plate P1, the blocking plate P2, and the blocking plate P3 are returned during a light emitting time, the blocking plate P1, the blocking plate P2, and the blocking plate P3 block the light irradiated to an exposed area of the substrate 2000 so that a stain may appear in the exposed area of the substrate 2000.

Referring to FIG. 12 and FIG. 13, the blocking plate P1, the blocking plate P2, and the blocking plate P3 are returned independent of each other. When the first blocking plate P1 is returned in the second direction D2 during the light emitting time, the light is irradiated to regions of the mask 570 and the substrate 2000 corresponding to the opening portion of the first blocking plate P1. Thus, a stain is not shown in the region of the substrate 2000 corresponding to the opening portion.

When, the light is irradiated to the substrate 2000 in a direction exactly perpendicular to the substrate 2000, the light is not irradiated to regions of the mask 570 and the substrate 2000 corresponding to the blocking portion of the first blocking plate P1. Thus, a stain may appear in the region of the substrate 2000 corresponding to the blocking portion.

However, the light source may not generate an exactly perpendicular light so that the light irradiated to the substrate 2000 may have an inclined angle CA with respect to the direction perpendicular to the substrate 2000. The light may be irradiated to the region of the substrate 2000 corresponding to the blocking portion of the first blocking plate P1 by the inclined angle CA. A region on the mask 570 corresponding to the blocking portion, to which the inclined light is irradiated, is known as a gray region.

Referring to FIG. 13, a first gray region GA1 is formed by a first end of the blocking portion of the first blocking plate P1. A second gray region GA2 is formed by a second end of the blocking portion of the first blocking plate P1.

A width of the gray region on the mask 570 extending in a second direction D2 from a line perpendicular to the first end of the blocking portion of the first blocking plate P1 is as follows: DG=DB×tan CA. Herein, DB is a distance between the first blocking plate P1 and the mask 570. CA is the inclined angle with respect to the direction perpendicular to the substrate 2000. Thus, the width of the gray region on the mask 570 in both directions with respect to the first end of the blocking portion of the first blocking plate P1 may be 2 DG.

When the second width W2 of the blocking portion is equal to or smaller than the width of the gray region of 2 DG, the region on the mask 570 corresponding to the blocking portion of the first blocking plate P1 may be entirely covered by the first gray region GA1 and the second gray region GA2.

The second blocking plate P2 may be returned in the second direction D2 in the same manner as the first blocking plate P1. In the returning process of the second blocking plate P2, the light emitting time may be adjusted such that the light may be emitted when the second blocking plate P2 is disposed in a different position from the first blocking plate P1 in the returning process of the first blocking plate P1.

The third blocking plate P3 may be returned in the second direction D2 in the same manner as the first blocking plate P1. In the returning process of the third blocking plate P3, the light emitting time may be adjusted such that the light may be emitted when the third blocking plate P3 is disposed in a different position from the first blocking plate P1 and the second blocking plate P2 in the returning process of the first blocking plate P1 and the second blocking plate P2.

A ratio of the blocking portion to the opening portion may be decreased compared with that of FIG. 5 so that an area of the substrate 2000, in which the stain appears, may be decreased.

Figure 14:
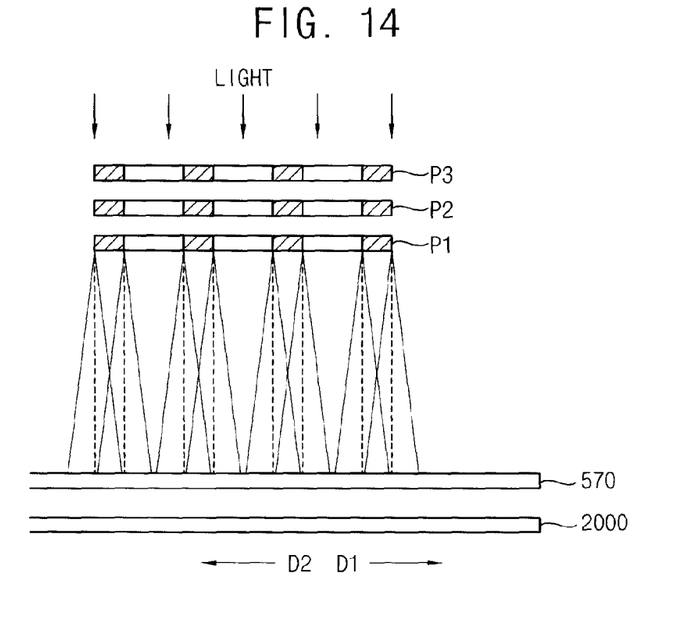
FIG. 14 is a cross-sectional view of a blocking plate and a gray region according to an exemplary embodiment of the present invention.

FIG. 14 is a cross-sectional view of a blocking plate and a gray area according to an exemplary embodiment of the present invention.

The exposure apparatus and the method of driving the exposure apparatus are substantially the same as the exposure apparatus and the method of driving the exposure described with reference to FIG. 10, FIG. 11, FIG. 12, and FIG. 13 except that the plurality of blocking plates overlap with each other in the returning operation. Thus, descriptions of common elements are omitted for clarity.

Referring to FIG. 14, the first blocking plate P1, the second blocking plate P2, and the third blocking plate P3 overlap with one another and are returned simultaneously. The first blocking plate P1, the second blocking plate P12, and the third blocking plate P3 are disposed such that the opening portions of the first blocking plate P1, the second blocking plate P2 and the third blocking plate P3 correspond to one another.

The opening portion of the first blocking plate P1 overlaps with the opening portions of the second blocking plate P2 and the third blocking plate P3. The blocking portion of the first blocking plate P1 overlaps with the blocking portions of the second blocking plate P2 and the third blocking plate P3.

In the returning process of the first blocking plate P1 in FIG. 12 and FIG. 13, a weak stain may appear in a first region of the exposure area of the substrate 2000. In the returning process of the second blocking plate P2 in FIG. 12 and FIG. 13, a weak stain may appear in a second region of the exposure area of the substrate 2000. In the returning process of the third blocking plate P3 in FIG. 12 and FIG. 13, a weak stain may appear in a third region of the exposure area of the substrate 2000. A weak stain may appear in a first region of the exposure area of the substrate 2000 because the first blocking plate P1, the second blocking plate P2, and the third blocking plate blocking plate P3 are returned simultaneously in FIG. 14.

In the returning process of FIG. 14 an area of the substrate 2000 in which the stain appears may be decreased. Furthermore, the returning process of the blocking plates may be expedited.

Figure 15:
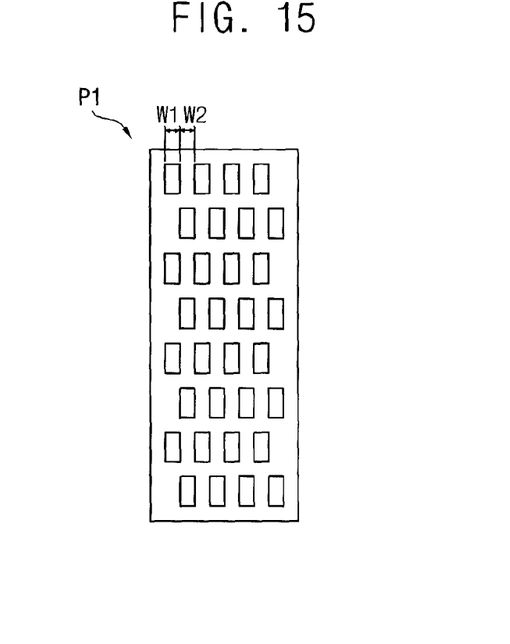
FIG. 15 is a plan view of a blocking plate according to an exemplary embodiment of the present invention.

FIG. 15 is a plan view of a blocking plate according to an exemplary embodiment of the present invention. FIG. 15 illustrates a shape of a first blocking plate P1 among a plurality of blocking plates.

The exposure apparatus and the method of driving the exposure apparatus are substantially the same as the exposure apparatus and the method of driving the exposure described with reference to FIG. 1, FIG. 2, FIG. 3, FIG. 4, FIG. 5, FIG. 6, FIG. 7, and FIG. 8 except for the shape of the blocking plate. Thus, descriptions of common elements are omitted for clarity.

Referring to FIG. 15, the first blocking plate P1 includes a blocking portion and an opening portion. The first blocking plate P1 may include a plurality of opening portions. The blocking portion and the opening portion of the first blocking plate P1 may be alternately disposed in the first direction D1.

The opening portions may be arranged in a checkerboard pattern. The opening portion may have a substantially rectangular shape. For example, the opening portion may have a square shape.

The second blocking plate P2 overlaps with the first blocking plate P1 and may have a shape substantially the same as the first blocking plate P1.

According to an exemplary embodiment, the blocking portion and the opening portion of the first blocking plate P1 are alternately disposed in the first direction D1 so that a stain in the first direction D1 may be decreased. In addition, the blocking portion and the opening portion of the first blocking plate P1 are alternately disposed in a direction perpendicular to the first direction D1 so that a stain may not easily appear to a user.

Figure 16:
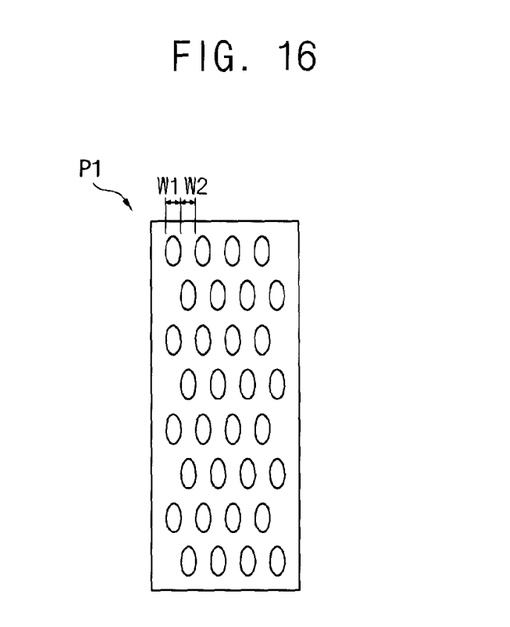
FIG. 16 is a plan view of a blocking plate according to an exemplary embodiment of the present invention.

FIG. 16 is a plan view of a blocking plate according to an exemplary embodiment of the present invention. FIG. 16 illustrates a shape of a first blocking plate P1 among a plurality of blocking plates.

The exposure apparatus and the method of driving the exposure apparatus are substantially the same as the exposure apparatus and the method of driving the exposure apparatus described with reference to FIG. 1, FIG. 2, FIG. 3, FIG. 4, FIG. 5, FIG. 6, FIG. 7, and FIG. 8 except for the shape of the blocking plate. Thus, descriptions of common elements are omitted for clarity.

Referring to FIG. 16, the first blocking plate P1 includes a blocking portion and an opening portion. The first blocking plate P1 may include a plurality of opening portions. The blocking portion and the opening portion of the first blocking plate P1 may be alternately disposed in the first direction D1.

The opening portions may be arranged in a checkerboard pattern. The opening portion may have a substantially oval shape. For example, the opening portion may have a circular shape.

The second blocking plate P2 overlaps with the first blocking plate P1 and may have a shape substantially the same as the first blocking plate P1.

According to the present exemplary embodiment, the blocking portion and the opening portion of the first blocking plate P1 are alternately disposed in the first direction D1 so that a stain in the first direction D1 may be decreased. In addition, the blocking portion and the opening portion of the first blocking plate P1 are alternately disposed in a direction perpendicular to the first direction D1 so that a stain may not easily appear to a user.

Thus, the blocking plate includes the opening portion so that a stain on the substrate may be decreased. Thus, a display quality of the display panel manufactured by the exposure apparatus may be improved.

According to an exemplary embodiment of an exposure apparatus and exemplary embodiments of a method of driving the exposure apparatus, a blocking plate includes an opening portion so that a stain on a substrate due to the blocking plate may be prevented when the blocking plate is returned. Thus, display quality of a liquid crystal display panel may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An exposure apparatus, comprising:
a light source to emit light in a light emitting cycle;
a mask disposed over a substrate comprising an exposure window, a pattern being formed therein;
a blind comprising at least one blocking plate group, each blocking plate group comprising a plurality of blocking plates in different planes configurable to block a non-exposed area of the substrate, each blocking plate comprising a blocking portion and an opening portion, the blind disposed over the exposure window to move in a first direction to block a non-exposed area of the substrate and to pass through the exposure window area in a second direction opposite to the first direction; and
a blind driver to drive the blind and configured to position blocking portions and opening portions of the plurality of blocking plates to block a non-exposed area of the substrate from light when the plurality of blocking plates are moved in the first direction, and to position blocking portions and opening portions of the plurality of blocking plates to form a gray region of light on the mask when the plurality of blocking plates are moved in the second direction,
wherein a width of the gray region in the first direction on the mask is:
DG=2×DB×tan CA wherein DB is a distance between one of the blocking plates and the mask, and CA is an inclined angle of the light from the light source with respect to a direction perpendicular to the substrate, and
a width of the blocking portion of the one blocking plate in the first direction is equal to or smaller than the width of the gray region.

2. The exposure apparatus of claim 1, wherein the plurality of blocking plates overlap with each other so that the blocking portion of a first blocking plate blocks the opening portion of a second blocking plate.

3. The exposure apparatus of claim 2, wherein a sum of widths of the blocking portions of each blocking plate in the first direction is larger than or equal to 1/N of a width of the blocking plate in the first direction and N is the number of blocking plates.

4. The exposure apparatus of claim 2, wherein the opening portion of each of the blocking plates is completely blocked while the blocking plates move in the first direction.

5. The exposure apparatus of claim 2, wherein the blocking plates are driven independent of each other when the blocking plates move in the second direction.

6. The exposure apparatus of claim 2, wherein the opening portion of each of the blocking plates overlap with each other when the blocking plates move in the second direction.

7. The exposure apparatus of claim 1, wherein the opening portion of each of the blocking plates extends in a direction substantially perpendicular to the first direction.

8. The exposure apparatus of claim 1, wherein the opening portion of each of the blocking plates is substantially rectangular in shape.

9. The exposure apparatus of claim 8, wherein the opening portion of each of the blocking plates is substantially square in shape.

10. The exposure apparatus of claim 1, wherein the blocking plate further comprises a plurality of opening portions arranged in a checkerboard pattern.

11. The exposure apparatus of claim 10, wherein the opening portion of each of the blocking plates is substantially oval in shape.

12. The exposure apparatus of claim 11, wherein the opening portion of each of the blocking plates is substantially circular in shape.

13. The exposure apparatus of claim 1, wherein the blocking plates form a first blocking plate group and a second blocking plate group,
the first blocking plate group comprises a first blocking plate and a second blocking plate, a blocking portion of the first blocking plate blocks an opening portion of the second blocking plate, the second blocking plate group comprises a third blocking plate and a fourth blocking plate, a blocking portion of the third blocking plate blocks an opening portion of the fourth blocking plate, and a width of the first blocking plate and the second blocking plate in the first direction is different from a width of the third blocking plate and the fourth blocking plate in the first direction.

14. An exposure apparatus, comprising:

a light source to emit light in a light emitting cycle;

a mask disposed over a substrate comprising an exposure window, a pattern being formed therein;

a blind comprising at least one blocking plate group, each blocking plate group comprising a plurality of blocking plates in different planes configurable to block a non-exposed area of the substrate, each blocking plate comprising a blocking portion and an opening portion, the blind disposed over the exposure window to move in a first direction to block a non-exposed area of the substrate and to pass through the exposure window area in a second direction opposite to the first direction; and a blind driver to drive the blind and configured to position blocking portions and opening portions of the plurality of blocking plates to block a non-exposed area of the substrate from light when the plurality of blocking plates are moved in the first direction, and to position blocking portions and opening portions of the plurality of blocking plates to form a gray region of light on the mask when the plurality of blocking plates are moved in the second direction, wherein the blocking plates form a first blocking plate group and a second blocking plate group, the first blocking plate group comprises a first blocking plate, a second blocking plate, and a third blocking plate, a blocking portion of the first blocking plate and a blocking portion of the third blocking plate blocks an opening portion of the second blocking plate, a blocking portion of the first blocking plate and a blocking portion of the second blocking plate blocks an opening portion of the third blocking plate, and a blocking portion of the second blocking plate and a blocking portion of the third blocking plate blocks an opening portion of the first blocking plate;

the second blocking plate group comprises a fourth blocking plate, a fifth blocking plate, and a sixth blocking plate, a blocking portion of the fourth blocking plate and a blocking portion of the fifth blocking plate blocks an opening portion of the sixth blocking plate, a blocking portion of the fourth blocking plate and a blocking portion of the sixth blocking plate blocks an opening portion of the fifth blocking plate, a blocking portion of the fifth blocking plate and a blocking portion of the sixth blocking plate blocks an opening portion of the fourth blocking plate, and a width of the first blocking plate, a width of the second blocking plate, and a width of the third blocking plate in the first direction is different from a width of the fourth blocking plate, a width of the fifth blocking plate, and a width of the sixth blocking plate in the first direction.

15. The exposure apparatus of claim 1, further comprising a stage to move the substrate in the first direction.

16. The exposure apparatus of claim 1, further comprising an image processor disposed under the mask, to read a pattern formed on the substrate and to align the substrate with the mask.

17. The exposure apparatus of claim 1, wherein the light source oscillates a laser beam based on light from a lamp.

18. A method of driving an exposure apparatus, the method comprising:

emitting light from a light source in a light emitting cycle;

moving a plurality of blocking plates located in different planes in a first direction to block light from reaching a non-exposed area of a substrate, wherein the blocking plates are disposed over the substrate and an exposure window of a mask, and the blocking plates comprise a blocking portion and an opening portion;

moving the blocking plates to pass through the exposure window area of the mask in a second direction opposite to the first direction;

positioning blocking portions and opening portions of the plurality of blocking plates to block a non-exposed area of the substrate from light when the plurality of blocking plates are moved in the first direction; and positioning blocking portions and opening portions of the plurality of blocking plates to form a gray region of light on the mask when the plurality of blocking plates are moved in the second direction, wherein a width of the gray region in the first direction on the mask is:

$DG=2 \times DB \times \tan CA$ wherein DB is a distance between one of the blocking plates and the mask, and CA is an inclined angle of the light from the light source with respect to a direction perpendicular to the substrate, and a width of the blocking portion of the one blocking plate in the first direction is equal to or smaller than the width of the gray region.

19. The method of claim 18, wherein the opening portions of the blocking plates are completely blocked when the blocking plates move in the first direction.

20. The method of claim 18, wherein the blocking plates are driven independent of each other when the blocking plates are moved in the second direction.

21. The method of claim 18, wherein the opening portions of the blocking plates overlap with each other when the blocking plates are moved in the second direction.

22. The method of claim 18, wherein the blocking plates form a first blocking plate group and a second blocking plate group, the first blocking plate group comprises a first blocking plate and a second blocking plate, a blocking portion of the first blocking plate blocks an opening portion of the second blocking plate, the second blocking plate group comprises a third blocking plate and a fourth blocking plate, a blocking portion of the third blocking plate blocks an opening portion of the fourth blocking plate, and a width of the first blocking plate and a width of second blocking plate in the first direction is different from a width of the third blocking plate and a width of fourth blocking plate in the first direction.

23. The method of claim 18, further comprising reading a pattern formed on the substrate and aligning the substrate with the mask according to the pattern.

* * * * *